United States Patent [19]

Weiss et al.

[11] Patent Number: 5,397,896
[45] Date of Patent: Mar. 14, 1995

[54] MULTIPLE SOURCE AND DETECTION FREQUENCIES IN DETECTING THRESHOLD PHENOMENA ASSOCIATED WITH AND/OR ATOMIC OR MOLECULAR SPECTRA

[75] Inventors: Paul Weiss; Stephen J. Stranick, both of, State College, Pa.

[73] Assignee: Penn State Research Foundation and Biotechnology Research and Development Corporation, University Park, Pa.

[21] Appl. No.: 92,016

[22] Filed: Jul. 15, 1993

Related U.S. Application Data

[63] Continuation-in-part of Ser. No. 56,348, Apr. 30, 1993, abandoned, which is a continuation-in-part of Ser. No. 916,165, Jul. 17, 1992, Pat. No. 5,268,573.

[51] Int. Cl.$^6$ ............................................. H01J 37/28
[52] U.S. Cl. ................................... 250/306; 250/307; 204/153.1; 204/400; 204/412
[58] Field of Search ............................... 250/306, 307; 204/153.1, 400, 412; 324/693, 713

[56] References Cited

U.S. PATENT DOCUMENTS

| | | | |
|---|---|---|---|
| 3,566,262 | 2/1971 | Thompson | 324/693 |
| 4,941,753 | 7/1990 | Wickramasinghe | 374/120 |
| 5,060,248 | 12/1990 | Dumoulin | 378/53 |
| 5,268,573 | 12/1993 | Weiss et al. | 250/306 |
| 5,281,814 | 1/1994 | Weiss et al. | 250/306 |

OTHER PUBLICATIONS

"A New Impedence Spectrometer for the Investigation of Electrochemical Systems," by Poporov et al., Rev. of Scientified Instruments, vol. 63, No. 11 pp. 5366–5372, Nov. 1992, N.Y.

"Scanning Tunneling Microscopy, Resonant Tunneling, and Counting Electrons: A Quantum Strandard of Current," by Guinea et al., Phys. Rev. Letters, vol. 65, No. 3, pp. 281–284, Jul. 1990, N.Y.

"Generation of Microwave Radiation in the Tunneling Junction of a Scanning Tunneling Microscope," by Krieger et al., Journ. of Vac. Sci. and Technol., vol. 41, No. 14, pp. 10229–10232, May 15, 1990, N.Y.

"Laser-Driven Scanning Tunneling Microscope," by Volker et al., Phys. Rev. Let., vol. 66, No. 13, pp. 1717–1720, Apr. 1, 1991, N.Y.

G. Meijer et al., Nature, 348, 621 (1990).

"Non-Linear Alternating-Current Tunneling Microscopy," Kochanski, Physical Review Letters, 62:19, pp. 2285–2288, May 1989.

(List continued on next page.)

Primary Examiner—Jack I. Berman
Attorney, Agent, or Firm—Majestic, Parsons, Siebert & Hsue

[57] ABSTRACT

Multiple frequency sources are used to apply a time varying signal to a scanning tunneling microscope and a current or voltage passing between the electrodes of the microscope is measured by a microwave spectrum/network analyzer which detects simultaneously at the multiple input frequencies and combinations thereof. This permits multiple substances to be monitored simultaneously. By choosing appropriate frequencies of input signals to be mixed or combined before application to the sample, it is possible to measure at a difference frequency which may improve signal to noise ratio and possible to match generating and reaction potentials and relaxation times to render detection possible. When applied to an array of Coulomb blockade devices used as a current standard, accuracy of the standard can be tested and the signal-to-noise ratio can be improved in the measurements, or the thresholds of the devices can be detected. Multiple frequency sources of light are used to apply a light signal to a scanning near-field optical microscope. After being modulated by the sample, the signal is detected and a spectrometer which detects simultaneously at the multiple input frequencies and combinations thereof. This permits multiple substances to be monitored simultaneously.

31 Claims, 13 Drawing Sheets

OTHER PUBLICATIONS

"A Versatile Microwave-Frequency-Compatible Scanning Tunneling Microscope," Stranick et al., *Rev. Sci. Instrum.*, 64(5):1232–1234, May 1993.

"Course Tip Distance Adjustment and Positioner for a Scanning Tunneling Microscope," Frohn et al., *Rev. Sci. Instrum.*, 60(6):1200–1201, Jun. 1989.

"Nanosources and Manipulation of Atoms Under High Fields and Temperatures: Applications," edited by Binn et al., NATO ASI Series, Series E: Applied Sciences, vol. 235, pp. 19–33.

Product brochure entitled "The Beetle STM-A Versatile, UHV Compatible Scanning Tunneling Microscope".

"An Easily Operable Scanning Tunneling Microscope," Besocke, *Surface Science*,181:145–153, 1987.

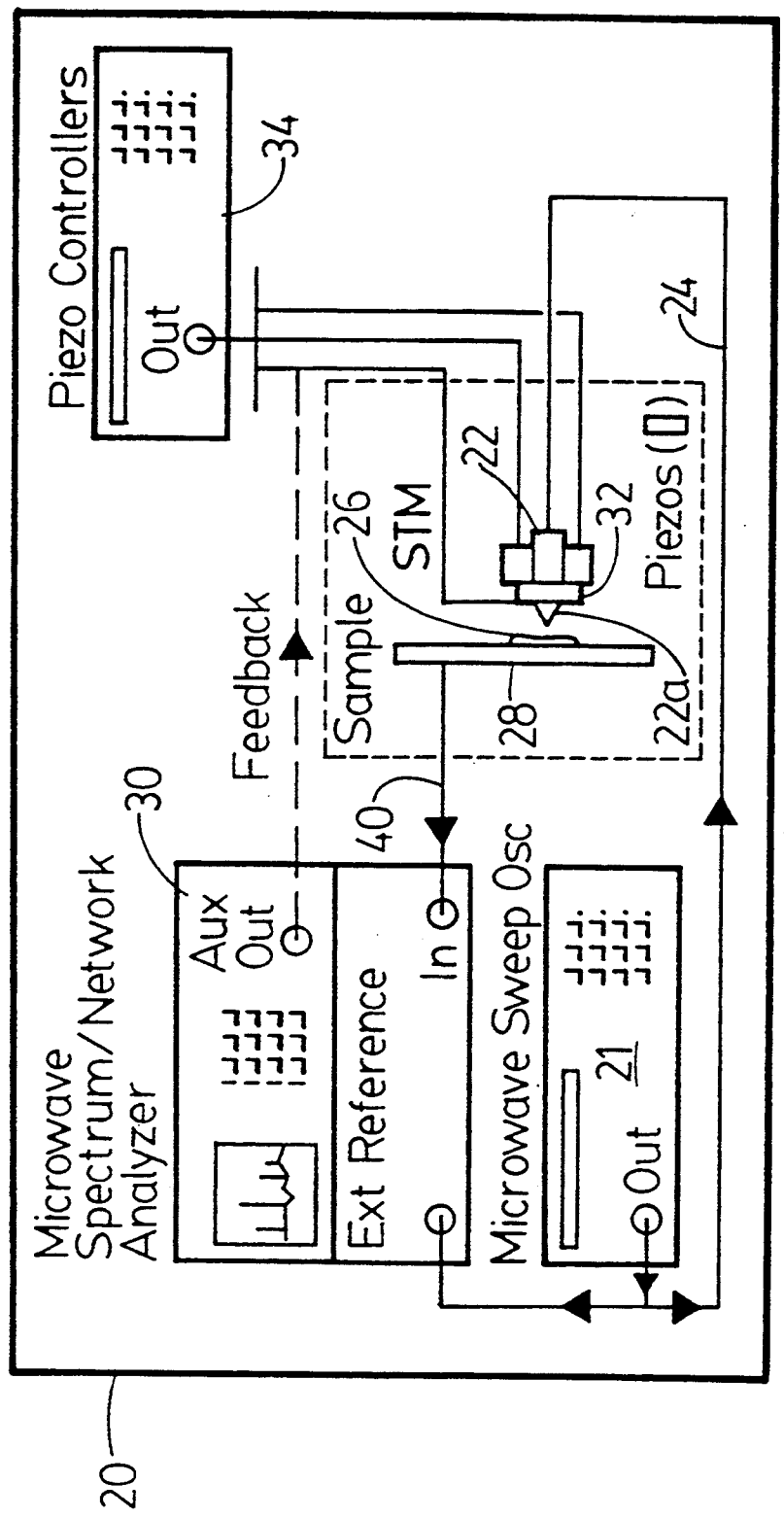
FIG._1.

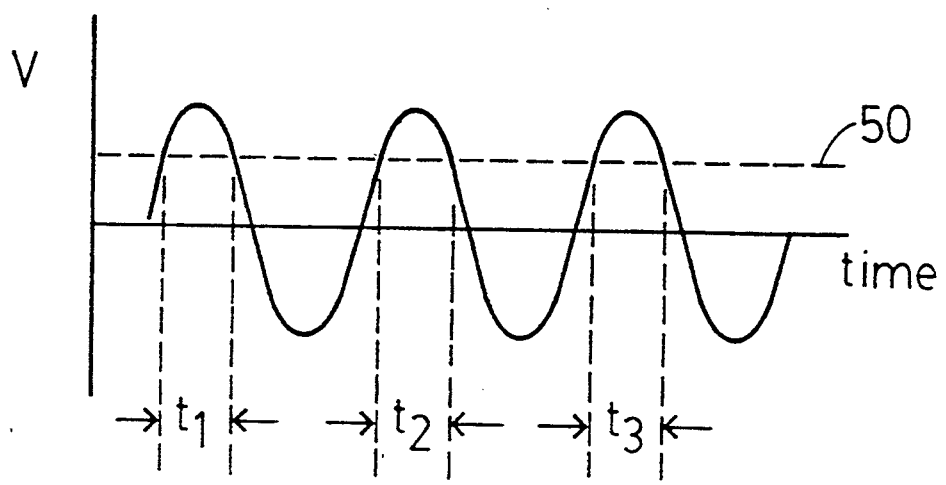
FIG._2A.
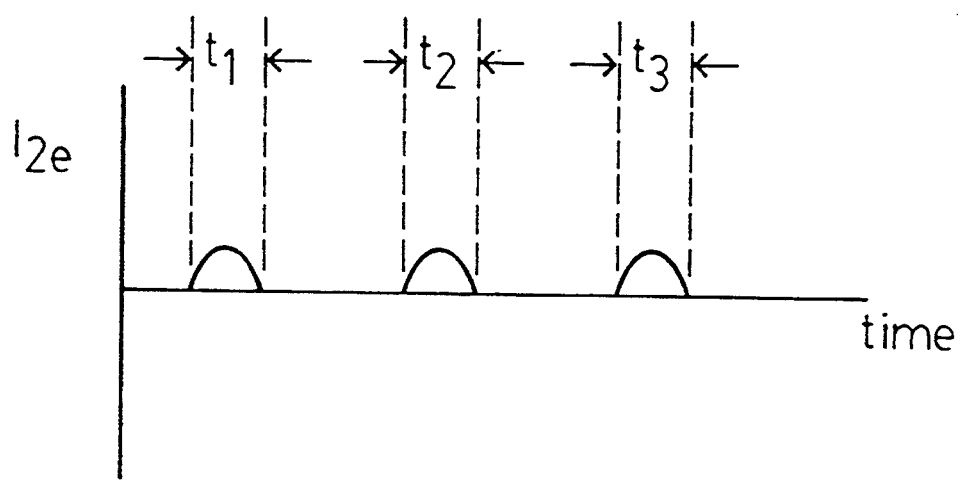
FIG._2B.

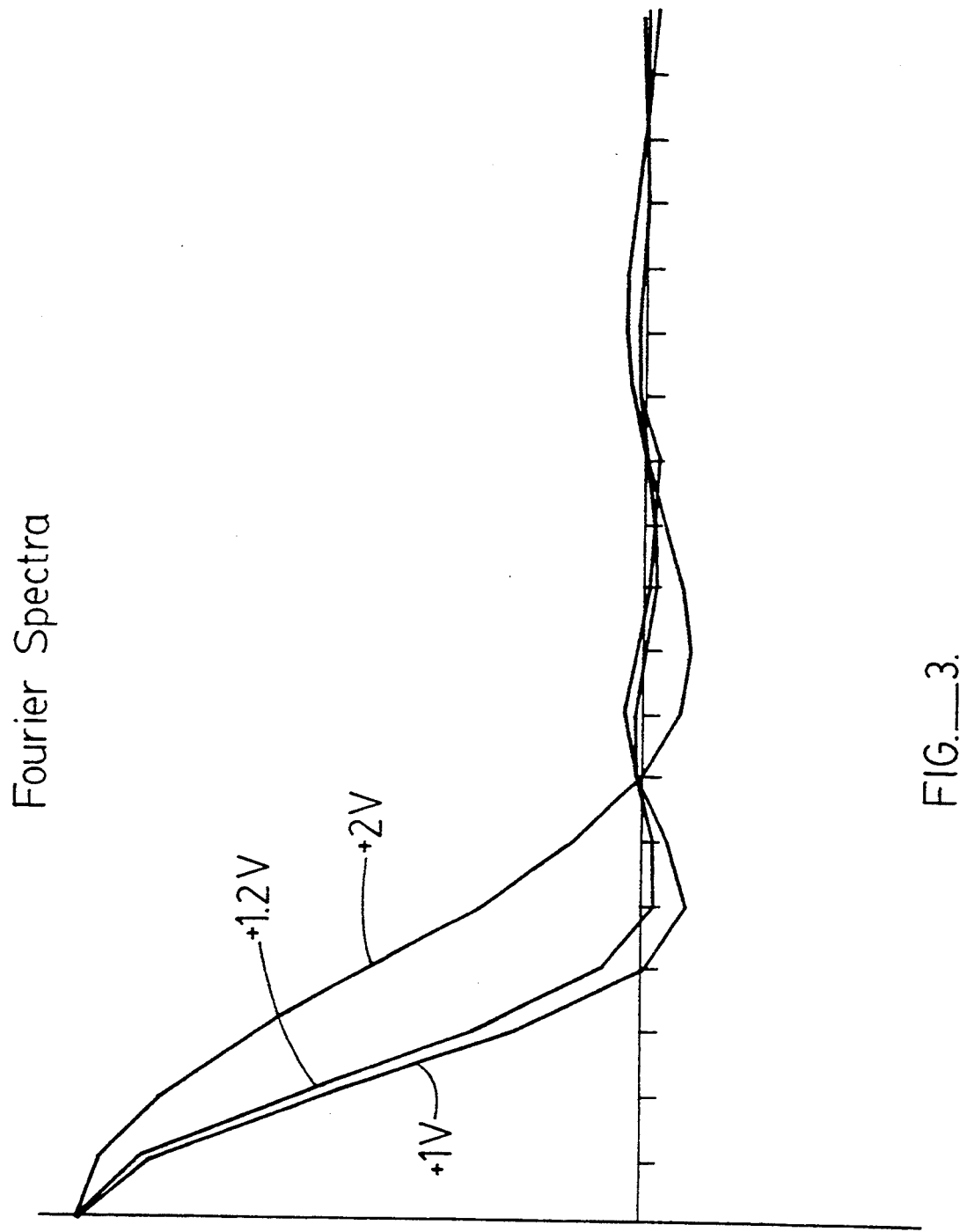

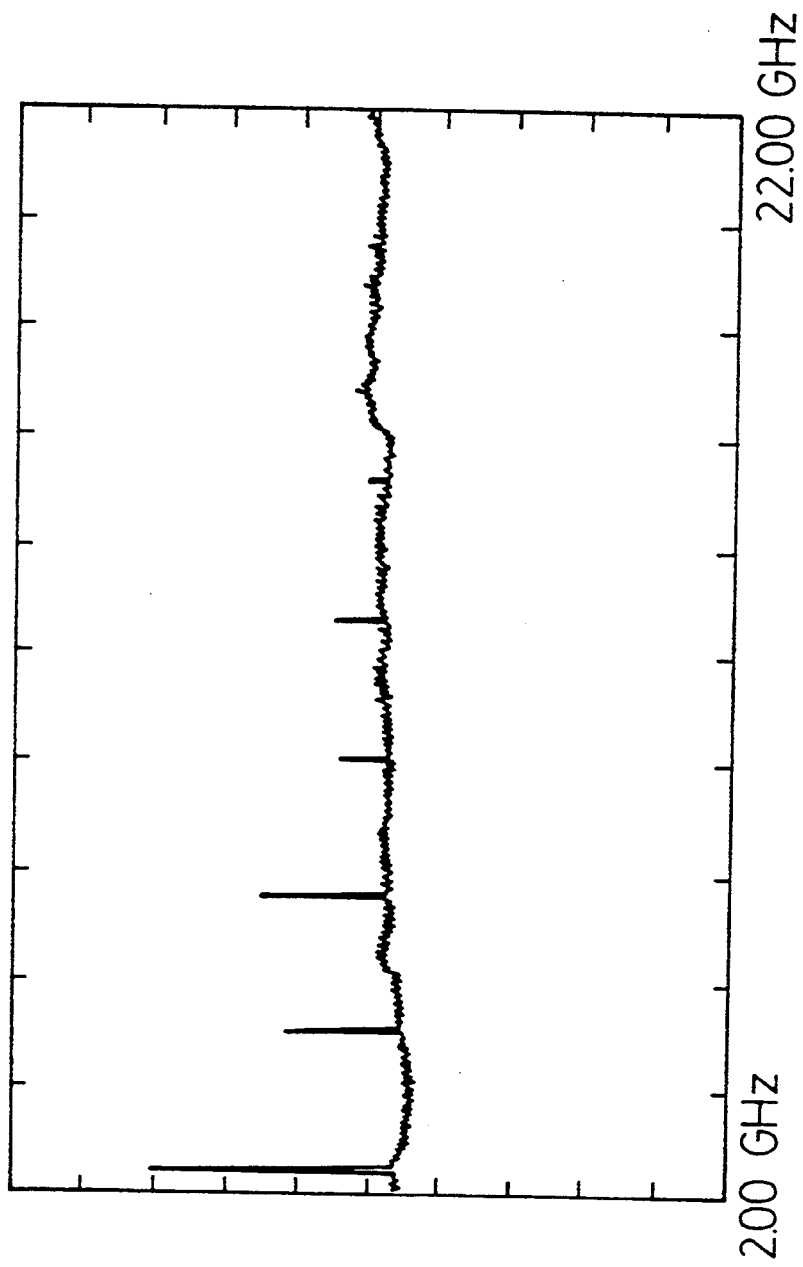
FIG._5.

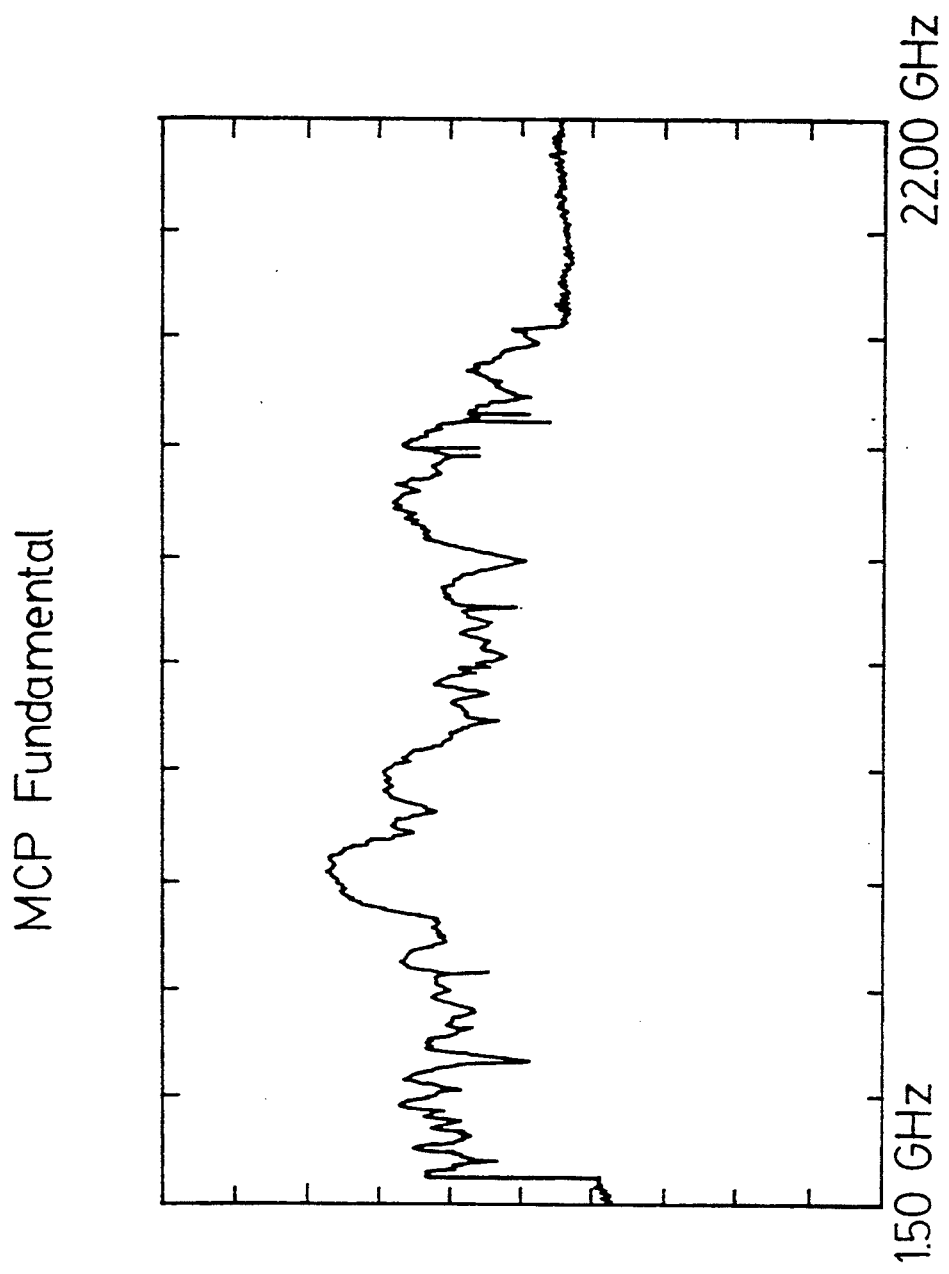
FIG._6.

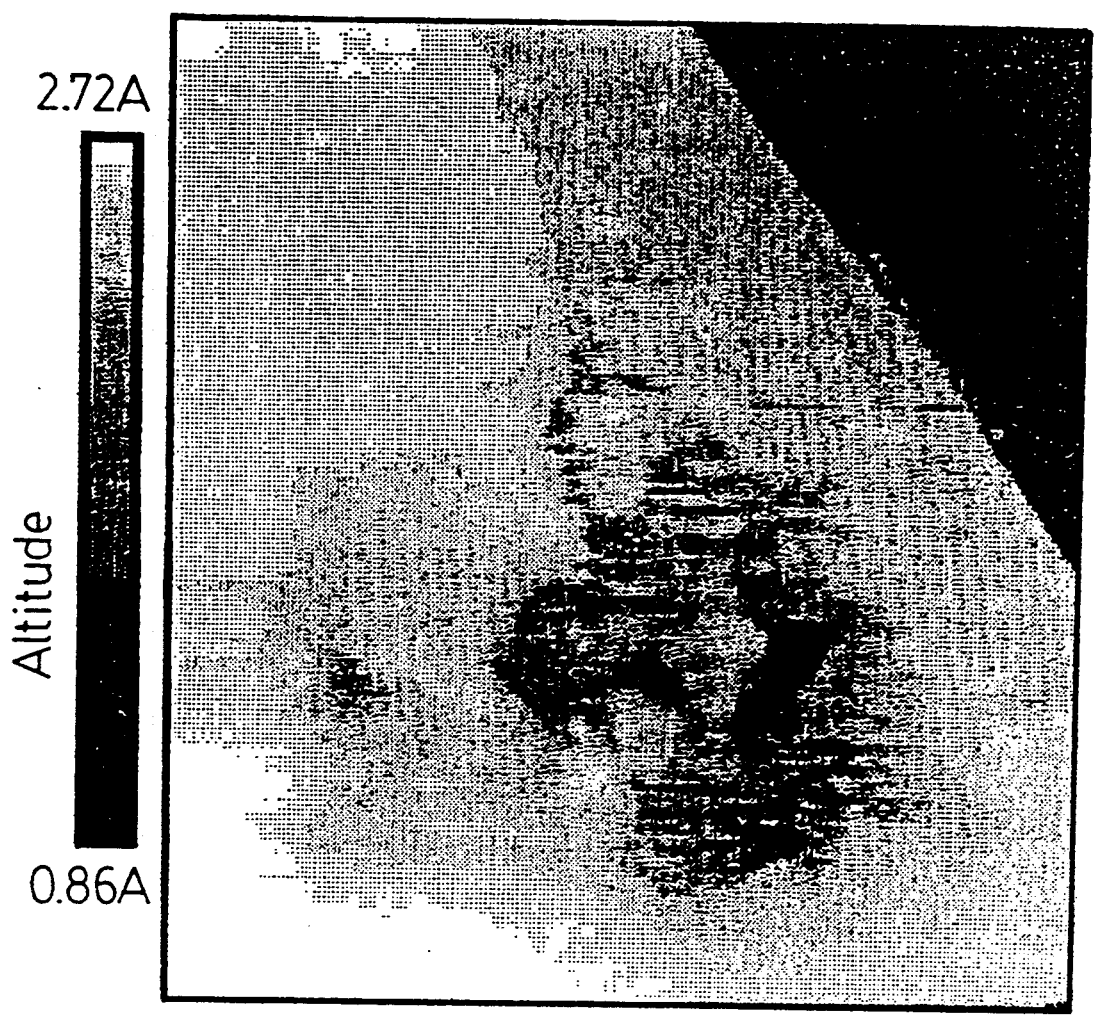
FIG._7.

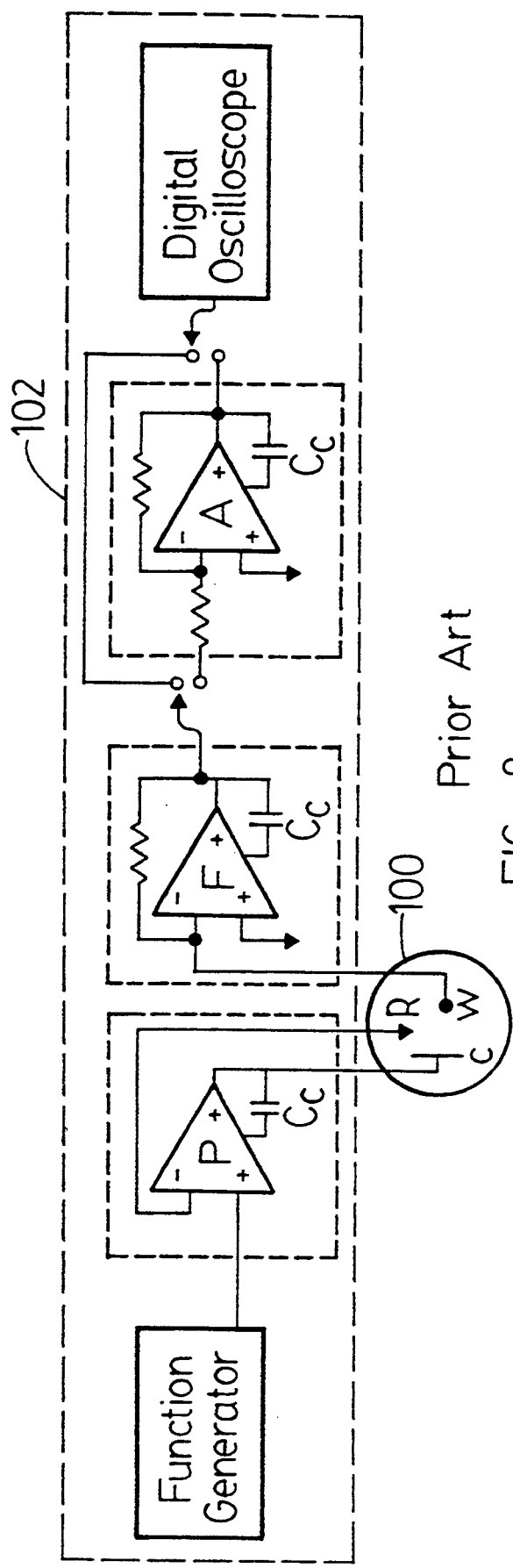
FIG._8.
Prior Art
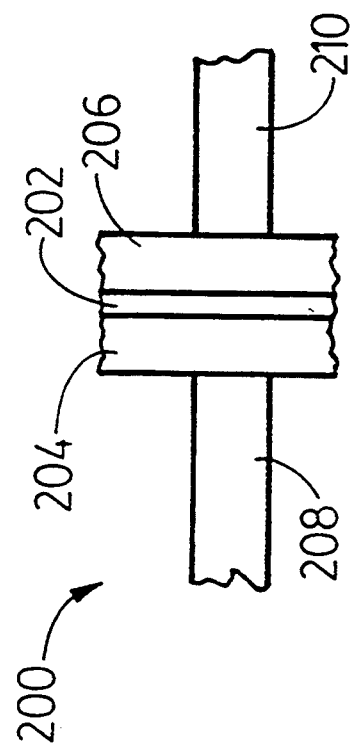
FIG._9.

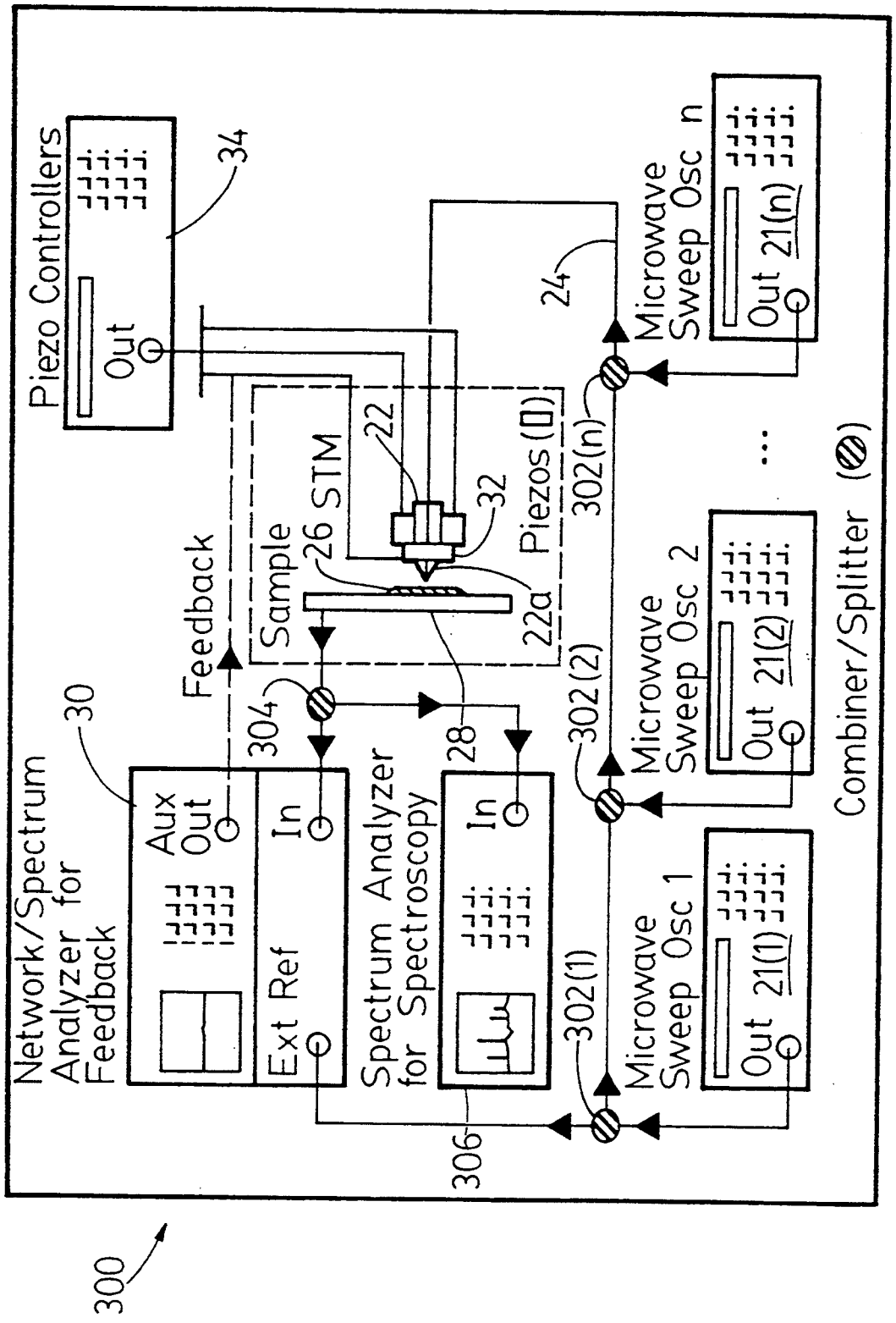
FIG._10.

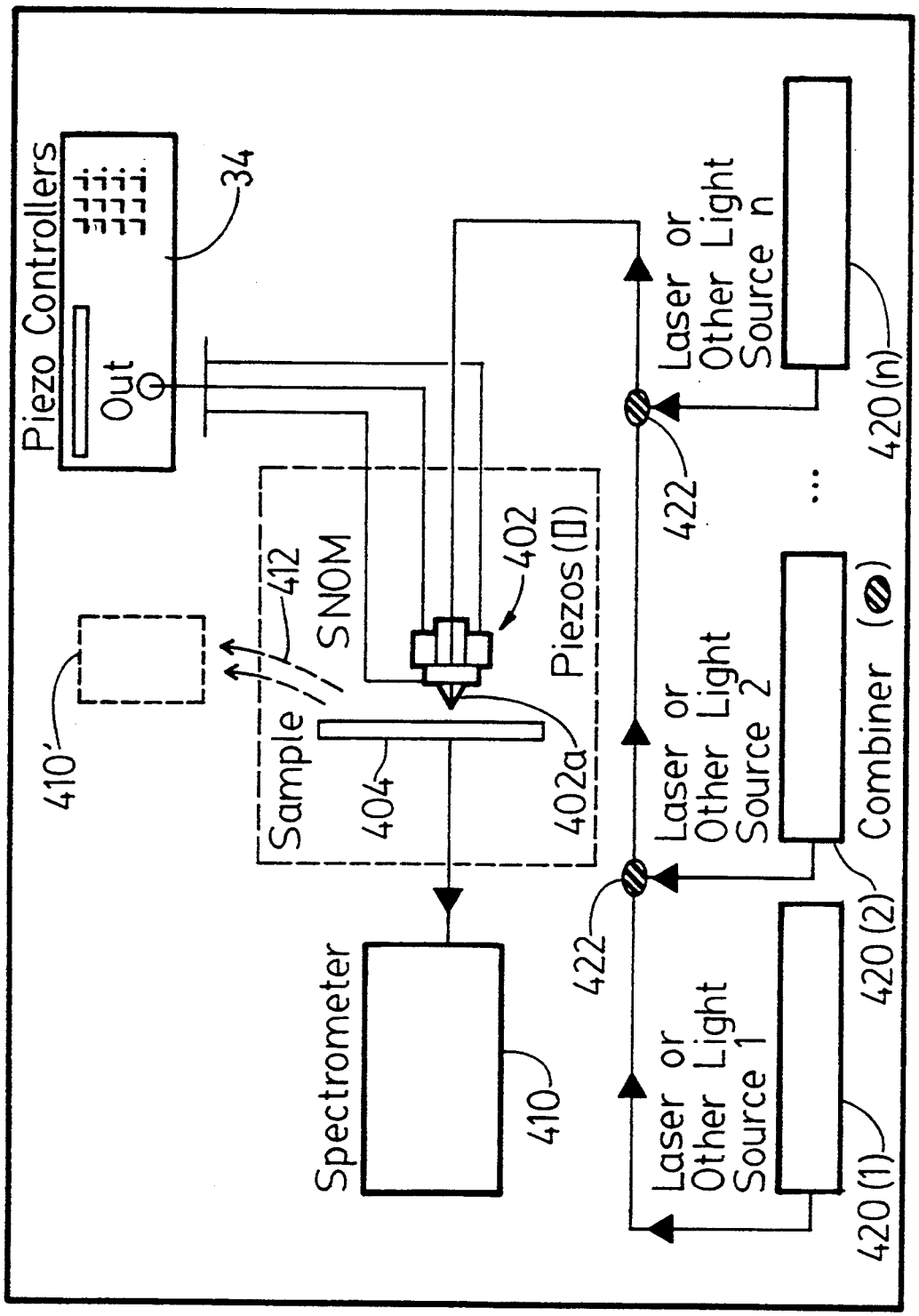
FIG._11.

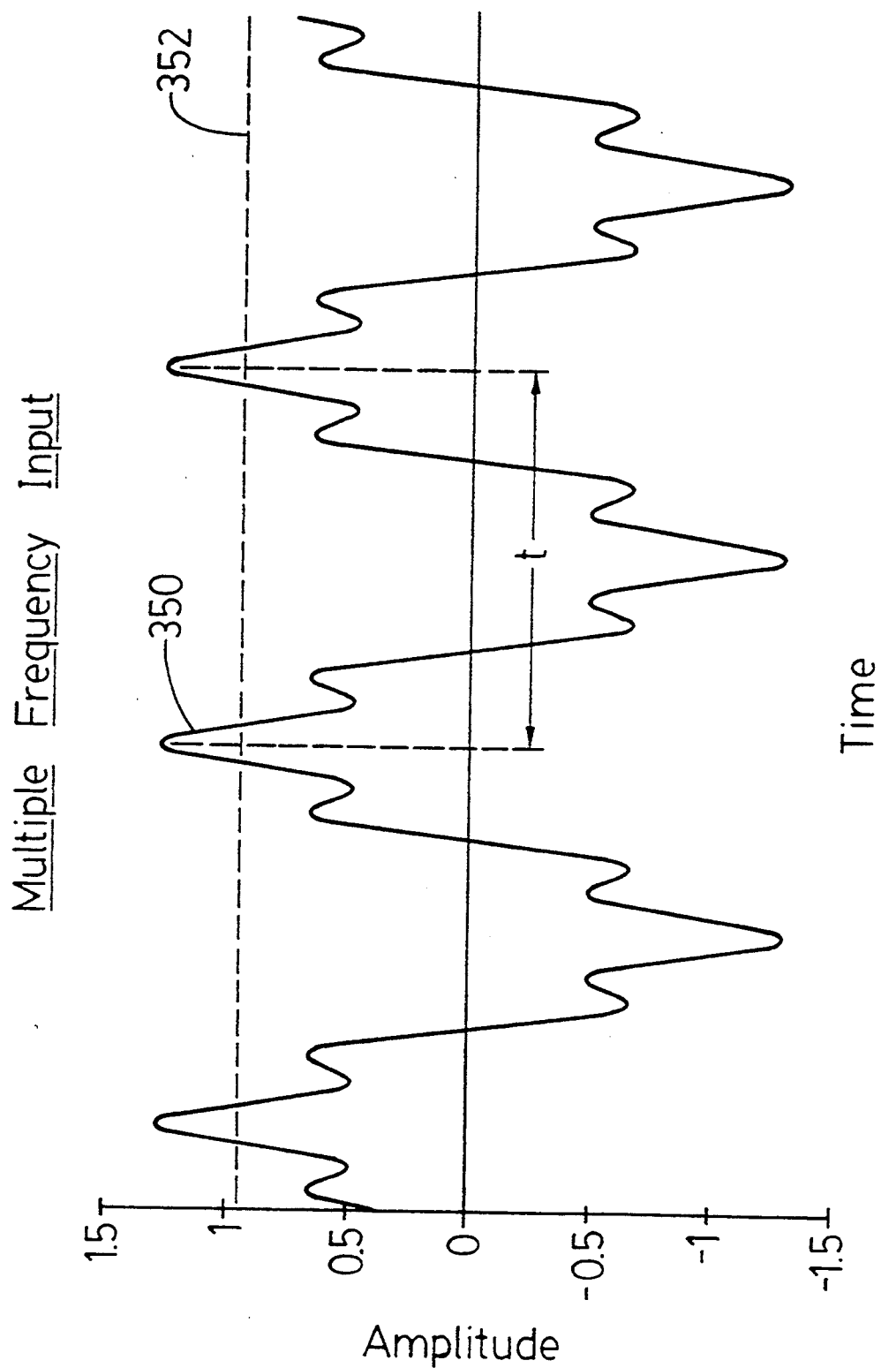
FIG._12.

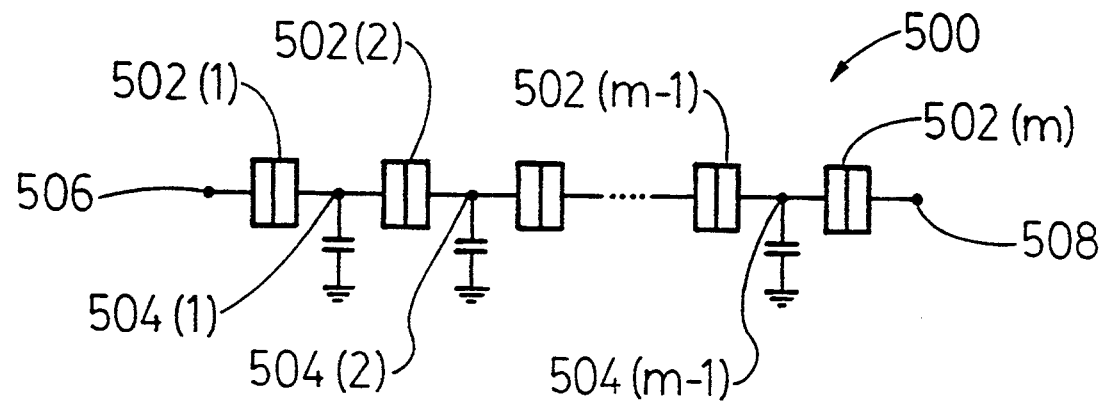
FIG._13A.
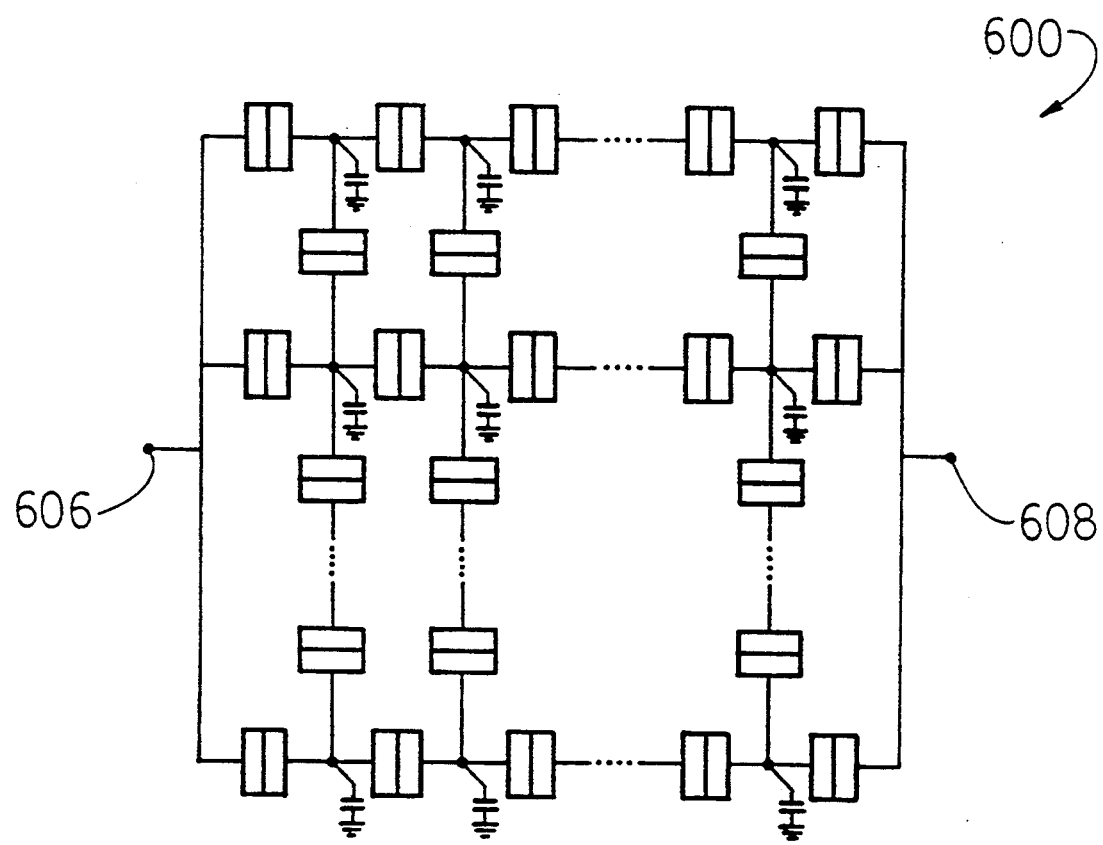
FIG._13B.

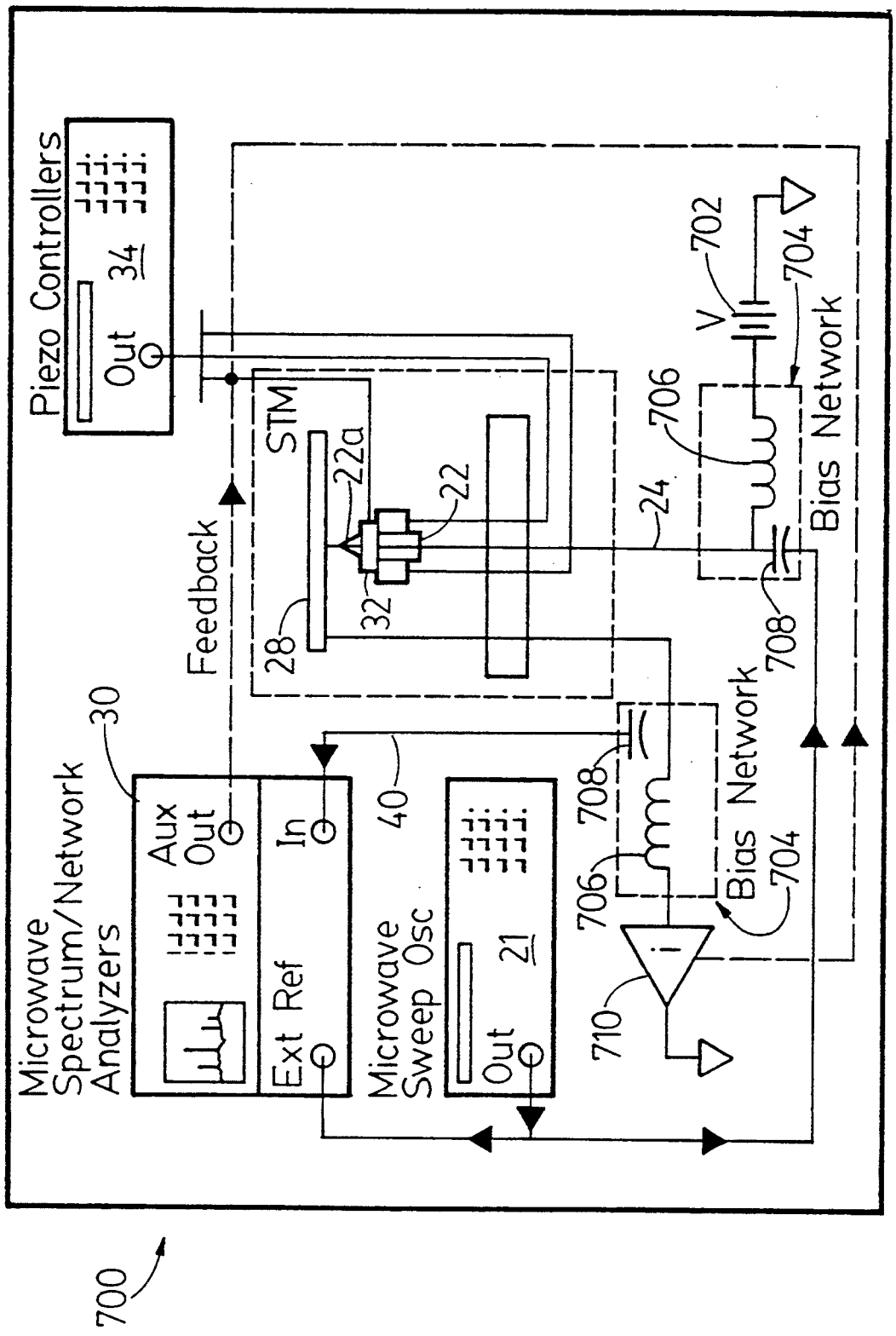
FIG._14.

MULTIPLE SOURCE AND DETECTION FREQUENCIES IN DETECTING THRESHOLD PHENOMENA ASSOCIATED WITH AND/OR ATOMIC OR MOLECULAR SPECTRA

This invention was made with support from the National Science Foundation, United States Government, under Grant No. CHE-9158375. The Government has rights in this invention.

CROSS-REFERENCE TO RELATED APPLICATIONS

This application is a continuation-in-part application of patent application Ser. No. 08/056,348, filed Apr. 30, 1993, entitled "Multiple Source and Detection Frequencies in Detecting Threshold Phenomena Associated with and/or Atomic or Molecular Spectra," now abandoned, which is a continuation-in-part application of patent application Ser. No. 916,165, filed Jul. 17, 1992, entitled "System for Detecting Threshold Phenomena Associated with and/or Atomic or Molecular Spectra of a Substance;", now U.S. Pat. No. 5,268,573, these two prior applications hereinafter referred to as the "parent applications." This application is also related to patent application Ser. No. 979,597, filed Nov. 20, 1992, entitled "System for Imaging and Detecting Threshold Phenomena Associated with and/or Atomic or Molecular Spectra of a Substance by Reflection of an A/C Electrical Signal," now U.S. Pat. No. 5,281,814.

This application is also related to an application entitled "Reading and Writing Stored Information by Means of Electrochemistry," by Paul S. Weiss, Barry Willis, and Stephan J. Stranick, filed on the same day as this application referred to below as the companion application. The parent applications and the companion application are incorporated herein by reference in their entirety.

BACKGROUND OF THE INVENTION

This invention relates to a system for detecting the threshold and spectra of substances at the atomic or molecular level, and in particular to the use of multiple source and detection frequencies in detecting threshold phenomena associated with and/or atomic or molecular spectra of one or more substances.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., *Nature* 348, 621 (1990). In "Non-Linear Alternating-Current Tunneling Microscopy," Kochanski, *Physical Review Letters,* 62:19, pp. 2285–2288 (May 1989), a method for scanning tunneling microscopy is described, where a non-linear alternating current (AC) technique is used that allows stable control of a microscope tip above insulating surfaces where direct current (DC) tunneling is not possible.

The STM has a counter electrode on which the sample to be investigated is placed and another electrode in the shape of a microscope probe with a tip placed at a small distance away from the sample surface. A DC or a low frequency AC signal is then applied across the pair of electrodes. The probe tip is then moved across the sample surface in a scanning operation and the changes in the current or voltage across the electrodes are monitored to detect the characteristics of the sample.

The distance between the probe tip and the counter electrode/sample is controlled by a piezoelectric driver in one of two possible modes: a constant current mode and a constant height mode. The current or voltage detected between the pair of electrodes is used to derive a control signal for controlling the piezoelectric driver in the constant current mode to change the distance between the probe tip and the sample so as to maintain a constant current between the electrodes. The voltage that has been applied to the piezoelectric driver in order to keep the tunneling current constant indicates the height of the tip z(x,y) as a function of the position (x,y) of the probe tip over the sample surface. A record of such voltages therefore indicates the topographical image of the sample surface.

The constant current mode can be used for surfaces which are not necessarily flat on an atomic scale. A disadvantage of the constant current mode is the response time required for the electronic and piezoelectric components in the feedback loop for controlling the piezoelectric driver; this response time sets relatively low upper limits for the scan speed.

To increase the scan speed considerably, the feedback loop response is slowed or turned off completely so that the probe tip is rapidly scanned at a constant average distance to the counter electrode irrespective of the contours of the sample surface. The rapid variations in the tunneling current are recorded as a function of location (x,y) to yield the topographic information of the sample surface. This is known as the constant height mode referring to the fact that the probe tip is maintained at a constant average distance from the counter electrode.

The constant height mode is advantageous over the constant current mode since it has a faster scan rate not limited by the response time of the feedback loop. Consequently, slow dynamic processes on surfaces can be studied. On the other hand, it is more difficult to extract the topographic height information from the variations of the tunneling current. Furthermore, unless the sample is atomically flat, the tip might crash into a surface protrusion of the sample. For a more complete description of the two operating modes of the STM's, please see "Scanning Tunneling Microscopy I," by H.-J. Güntherodt R. Wiesendanger (Eds.), Springer-Verlag, pp. 5–6.

In the article referenced above, Kochanski proposes to investigate insulating films by applying an AC current between the electrodes at frequency $\omega$ and the current between the electrode at $3\omega$ is detected. The AC signal is generated using a 2 GHz resonant cavity so that the frequency or frequencies of the signal applied to the STM electrodes and detected must be fixed in the scanning operation performed by Kochanski.

SUMMARY OF THE INVENTION

As an improvement to the invention in the parent application, this application covers the use of multiple source and detection frequencies for detecting threshold phenomena or atomic or molecular spectra.

One aspect of the invention is directed towards an apparatus for detecting threshold phenomena associated with and/or atomic or molecular spectra of at least two substances in the vicinity of each other. The apparatus comprises a source providing a time varying electrical signal and electrodes for coupling the signal to said at least two substances. Said signal includes components of at least two different frequencies that are individually or in various combinations characteristic of the at least two substances. The apparatus further comprises a circuit substantially simultaneously measuring the amplitudes of the currents or voltages across the substances at said at least two frequencies or their harmonics, or their sums and differences or various combinations thereof to detect threshold phenomena associated with and/or atomic or molecular spectra of the at least two substances.

Another aspect of the invention is directed towards a method for detecting threshold phenomena associated with and/or atomic or molecular spectra of at least two substances in the vicinity of each other. The method comprises providing a time varying electrical signal and coupling the signal to the at least two substances. The signal includes components of at least two different frequencies that are individually or in various combinations characteristic of the at least two substances. The method further comprises substantially simultaneously measuring the amplitudes of the currents or voltages across the substances at said at least two frequencies or their harmonics, or their sums and differences or various combinations thereof to detect threshold phenomena associated with and/or atomic or molecular spectra of the at least two substances.

Another aspect of the invention is directed towards an apparatus for detecting threshold phenomena associated with and/or atomic or molecular spectra of at least one substance comprising a source providing a time varying electrical signal and electrodes for coupling the signal to the at least one substance. The signal includes components of at least two different frequencies. The source includes at least two signal generators, each providing an electrical signal with frequencies in a frequency band including one of the at least two frequencies, and a combiner connecting the generators. The apparatus further comprises a device substantially simultaneously measuring the amplitudes of the current or voltage across the substance at frequencies including said at least two frequencies or various combinations thereof.

Yet another aspect of the invention is directed towards a method for detecting threshold phenomena associated with and/or atomic or molecular spectra of at least one substance. The method comprises providing time varying electrical signals of at least two different frequencies, combining the signals, and coupling the combined signal to said at least one substance. The method further comprises substantially simultaneously measuring the amplitudes of the current or voltage across the substance at frequencies including said at least two frequencies or various combinations thereof.

The above-described use of multiple source and detector frequencies is also applicable to scanning near-field optical microscopy (SNOM) and other systems employing electromagnetic signals. Thus, another aspect of the invention is directed towards an apparatus for detecting threshold phenomena associated with and/or atomic or molecular spectra of two or more substances in the vicinity of each other. The apparatus comprises a source for providing an electromagnetic signal and means for coupling the signal to said two or more substances so that the signal is modulated by the substance. The signal provided by the source includes components of at least two different frequencies, said two frequencies being characteristic of said two substances. The apparatus further comprises a device substantially simultaneously measuring the intensity of the modulated signal at said at least two frequencies or various combinations thereof to detect threshold phenomena associated with and/or atomic or molecular spectra of the at least two substances.

Yet another aspect of the invention is directed towards a method for detecting threshold phenomena associated with and/or atomic or molecular spectra of two or more substances in the vicinity of each other. The method comprises providing an electromagnetic signal and coupling the signal to said at least two or more substances so that the signal is modulated by the substance. The signal provided includes components of at least two different frequencies that are characteristic of said two substances. The method further comprises substantially simultaneously measuring the intensity of the modulated signal at said at least two frequencies or various combinations thereof to detect threshold phenomena associated with and/or atomic or molecular spectra of the at least two substances.

BRIEF DESCRIPTION OF THE DRAWINGS

FIG. 1 is a schematic diagram of a high frequency STM for imaging insulator surfaces using throughput attenuation with a network analyzer, or using non-linear harmonic recording with a spectrum analyzer.

FIG. 2A is a graphical illustration of the modulated bias voltage used in the apparatus of FIG. 1 over time, where the dashed line shows the voltage threshold for a second electron to hop to (or from) the surface.

FIG. 2B is a graphical illustration of the resulting current due to the effect of the second electron versus time when the bias voltage of FIG. 2A is applied in the apparatus of FIG. 1.

FIG. 3 is a graphical illustration of the Fourier spectra detected when an AC signal is applied across a substance to be measured. The Fourier spectra includes three different graphs for three different substances having different thresholds.

FIG. 5 is a graphical illustration of the ratio of the current or voltage measured to the voltage or current applied to the STM electrodes across a predetermined spectrum when an AC signal of 2.5 GHz is applied across a substance.

FIG. 6 is a graphical illustration of the ratio of the current or voltage measured at the fundamental frequency to the voltage or current applied to the STM electrodes at the fundamental frequency to electrodes across a substance.

FIG. 7 is a plot of the alternating current STM image of the edge of a pore on a surface showing the microscopic details of the surfaces scanned.

FIG. 8 is a schematic diagram of an electrochemical cell and a circuit diagram of a potential controlling and current measuring instrument for monitoring the electrochemical cell in a conventional arrangement.

FIG. 9 is a schematic diagram of a Coulomb blockade device to illustrate the invention.

FIG. 10 is a schematic diagram of a high frequency STM and multiple oscillators and combiners for providing an AC signal of multiple frequencies and a network or spectrum analyzer for measuring simultaneously at multiple frequencies to illustrate the invention.

FIG. 11 is a schematic diagram of a near-field scanning optical microscope and a number of light sources and combiners for providing light at different frequencies and a spectrometer for detecting light at different frequencies to illustrate the invention.

FIG. 12 is a graphical illustration of an AC signal resulting by combining two signals of two different single frequencies to illustrate the invention.

FIGS. 13A, 13B are schematic diagrams illustrating a one-dimensional and a two-dimensional array respectively of Coulomb blockade devices to illustrate the invention.

FIG. 14 is a schematic diagram of a high frequency STM for imaging insulator surfaces using throughput attenuation with a network analyzer, or using non-linear harmonic recording with a spectrum analyzer, and a DC source and detector.

Identical components in the different figures are labeled by the same numerals in this application.

DETAILED DESCRIPTION OF THE PREFERRED EMBODIMENT

Figure 4:
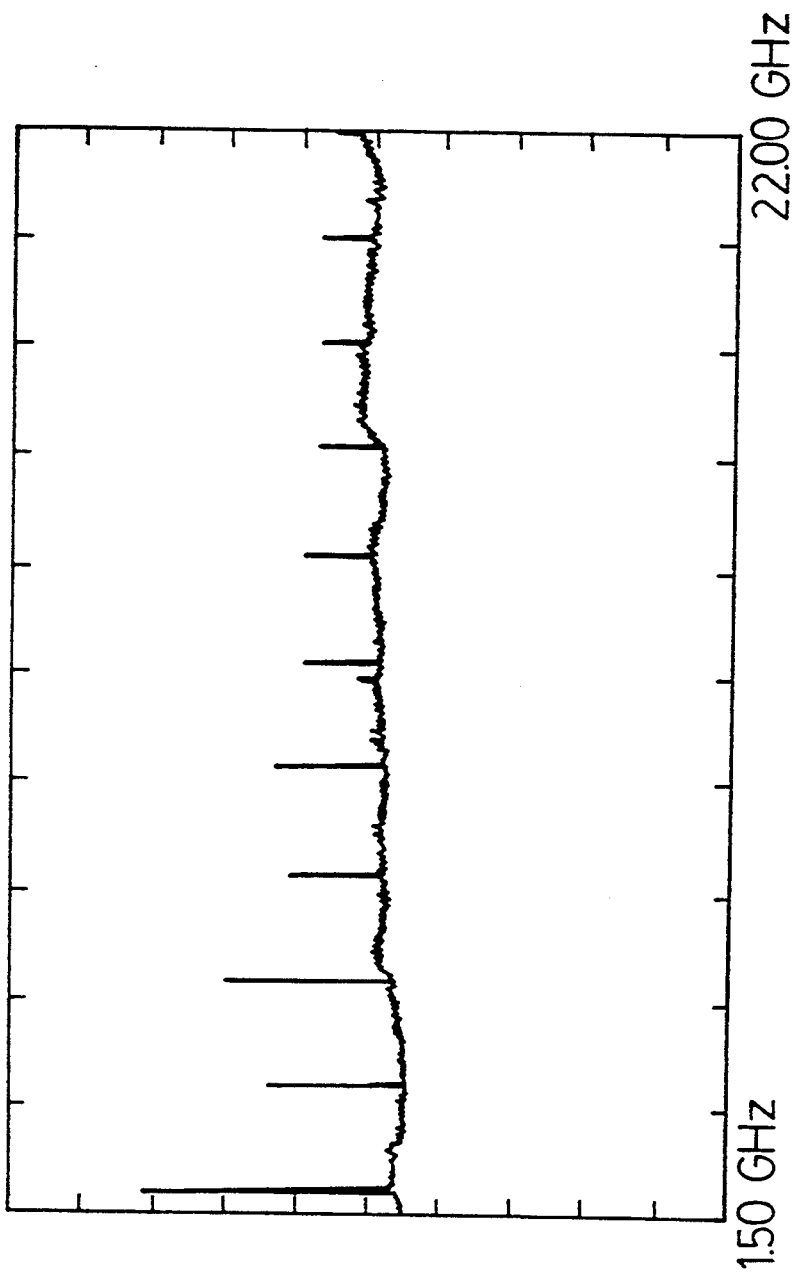
FIG. 4 is a graphical illustration of the ratio of the current or voltage measured to the voltage or current applied to the STM electrodes across a predetermined spectrum when an AC signal of 2 GHz is applied across a substance.

Much of the description of the embodiment in the parent application is incorporated herein and is set forth below by reference to FIG. 1–9, which are also figures of the parent applications.

FIG. 1 is a schematic diagram of a system 20 including a high frequency scanning tunneling microscope for imaging samples using throughput attenuation with a network analyzer, or using non-linear harmonic recording with a spectrum analyzer to illustrate the preferred embodiment of the invention of the parent application. As shown in FIG. 1, a microwave sweep oscillator 21 generates an AC signal and applies it to microscope probe 22 with tip 22a (or to the sample 26 through counter electrode 28, not shown in FIG. 1) through line 24. Tip 22a is placed close to but spaced apart (by vacuum, a gas or a fluid) from a sample 26 which is placed on top of the counter electrode 28. Counter electrode 28 is connected to microwave spectrum/network analyzers 30. The position of the probe tip 22a over sample 26 is controlled by piezoelectric crystal 32 which is in turn controlled by piezo controllers 34. Controllers 34 receive from analyzers 30 a signal to be used for feedback.

In operation, the microwave sweep oscillator 21 applies the AC signal to tip 22a and analyzers 30 applies typically a reference voltage such as a virtual ground to counter electrode 28. The current or voltage between electrodes 22, 28 is monitored by analyzers 30 which derives a feedback signal for controlling controllers 34. In the constant current mode, this feedback signal is applied to the piezo controllers 34 for moving the tip 22a away from or towards the sample 26 in order to maintain a constant signal amplitude between electrodes 22, 28. In constant height mode, the distance between tip 22a and counter electrode 28 is maintained at a constant value and the feedback signal derived from the output of analyzers 30 is either not applied to controllers 34 or attenuated to a very low value before it is applied to controllers 34.

The scheme in reference to FIG. 1 differs from Kochanski's described above in that a tunable source is used to generate the AC signal applied across the electrodes and the amplitudes of the current or voltage can be measured simultaneously at frequencies within a predetermined spectrum using the analyzer. Analyzer 30 then computes the ratio between the amplitudes of the current or voltage measured to the amplitudes of the voltage or current applied by oscillator 21 to probe 22 at frequencies over a predetermined range or spectrum. Where the amplitudes are measured using a network analyzer, both the amplitudes and phases of current or voltage can be measured and used for imaging or spectroscopy.

When a voltage is applied across electrodes 22, 28, depending on the threshold of the substance in sample 26 at the position of the tip 22a and the distance between sample 26 and the tip 22a, electrons may tunnel between tip 22a and the sample. Such tunneling phenomena has been the subject of studies, one of which is set forth in the article "Single Electronics," by Likharev et al., *Scientific American*, pp. 80–85 (June 1992). As noted by Likharev et al., the application of a voltage across an insulating layer will cause a surface charge Q to build up across the barrier. When an electron tunnels through the insulating layer, the surface charge Q will change exactly by $+e$ or $-e$, depending on the direction of tunneling, where e is the electrical charge of a single electron. If the charge Q at the junction is greater than $+e/2$, an electron can tunnel through the junction in a particular direction, subtracting e from Q. The electron will tunnel in the opposite direction if the charge Q is less than $-e/2$. If Q is less than $+e/2$ and greater than $-e/2$, tunneling in any direction would increase the energy of this system. If the initial charge is within this range, tunneling would not occur and this suppression of tunneling is known as Coulomb blockade.

If the surface charge Q falls outside the range for Coulomb blockade so that electron tunnels through the insulating layer, which may cause the surface charge Q to fall within such range again. In such event, further tunneling is not possible. This is caused by the effect of the electric field exerted by the electron which has tunneled through on other electrons which may follow in its path.

The effect of applying a sinusoidal voltage across two electrodes separated by an insulating layer is shown in FIG. 2A. Thus, when the voltage applied exceeds a certain threshold 50 shown in dotted line in FIG. 2A, this causes the surface charge across the insulating layer to exceed the Coulomb blockade range. Thus, it is only during the time periods t1, t2, t3 that more than one electron can tunnel through the insulating layer in a single cycle to cause the current flow as shown in FIG. 2B.

The invention of the parent application is based on the observation that the threshold voltage of the substance in the sample can be determined by measuring the amplitudes of the current or voltage across electrodes over a predetermined frequency spectrum. Also, by inverse Fourier transform from the frequency domain to the time domain or by measuring directly in the time domain, graphs such as those in FIG. 2B can be obtained for determining the threshold of the substance in the sample. The Fourier spectra of three different substances with respective thresholds of 1 volt, 1 and 2 volts, and 2 volts are illustrated in FIG. 3. Thus, by performing an inverse Fourier transform of the three spectra, the respective thresholds of 1 volt, 1 and 2 volts, and 2 volts can be obtained. In this connection, FIG. 4 is a graphical illustration of a spectrum of a substance when a 2 GHz signal is applied by oscillator 20 across electrodes. FIG. 5 is a graphical illustration similar to that of FIG. 4 except that the oscillator applies an AC signal of 2.5 GHz instead of 2 GHz.

As illustrated in FIGS. 2A, 2B, when the amplitude of the AC signal applied across the electrodes is varied, such as where the amplitude is continually increased, one will see a sudden increase in the current flow between the electrodes when a threshold is reached. This will cause a sudden change in current and voltage across the electrodes which can be detected to indicate the presence of a threshold. This may be accomplished by comparing the amplitudes of the high harmonics to those of the low harmonics of the driving frequency of oscillator 21. When the amplitude of the AC signal applied across the electrodes is varied by gradually reducing the amplitude, the surface charge buildup on one side of the insulating barrier caused by the tunneling electrodes would tend to dissipate because of the mutual repulsion of the electrons. The dissipation rate of the electrons will reveal the rates of motion of charges in the substance, and the charge transport characteristics of the substance. When the amplitude of the signal is varied, the frequency of the signal is preferably kept substantially constant.

Oscillator 21 may be used to provide different frequency input AC signals across the electrodes. The amplitudes of the current or voltage across the electrodes may be measured as described above to obtain the spectra such as those shown in FIGS. 3-5 for different frequency input signals. Preferably, the amplitude of the signal provided in the above procedure remains substantially unchanged when the frequency of the signal provided by oscillator 21 is varied. From the various spectra obtained, an optimum value may be obtained for the frequency of the signal applied by oscillator 21, such as one which maximizes the signal detected. FIG. 6 illustrates such a feature. FIG. 6 shows the frequency response at the fundamental for tip 22a at the same spot of the sample. In other words, FIG. 6 is a plot of the ratio of the amplitude at the fundamental frequency of the current or voltage measured to the amplitude of the voltage or current applied to the electrodes, as the fundamental frequency of the signal applied by oscillator 21 is swept from 1.5 to 22 GHz. In other words, if the frequency response at the fundamental frequency is measured as the frequency of the applied signal sweep, the optimum frequency is indicated by the peak of the curve in FIG. 6 at about 7.7 GHz. This indicates that when the input signal is at such frequency, the signal recorded is maximum at the fundamental frequency. Obviously, the amplitudes at frequencies other than the fundamental may be used instead and are within the scope of the invention. FIG. 6 is obtained by sweeping the fundamental frequency supplied by the oscillator 21 under control of the analyzer 30, although this frequency can also be swept independently.

Once the optimum frequency is discovered, oscillator 21 may be tuned to such frequency and the STM is used in an otherwise conventional manner in either the constant current or constant height mode for differentiating surface species or for obtaining images of the surfaces of a substance or sample. By selecting particular frequencies which allow contrast between different surface species, the AC STM can be used to generate a map of the chemical species, the chemical environment or physical structure on the surface.

It is important to determine the spectral match (or lack thereof) between measurements of a known species and an unknown. The information may be used to determine the surface composition of one area versus another, or to intercompare an unknown with a previously characterized sample. Samples that can be visually intercompared with known spectra for identification purposes are the simplest case. If the differences are more subtle, a mathematical convolution of the known and unknown to highlight the differences assists the user to see the degree of agreement or lack thereof between the spectra. Where multiple source and detection frequencies are employed in the invention of the present application, such convolution is especially useful since more data would be available for a constrained fit. There are cases where the spectra are qualitatively very similar, or the signal to noise ratio is poor, or it is desired to have a numerically based recognition of match. A statistical intercomparison of the spectra can be used to differentiate an unknown amongst a wide range of candidates. There are many approaches. Amongst them are the least square distance between spectra or a calculation of the eigenvector distance between spectra in n-dimensional space.

Where the amplitudes of the current or voltage are to be measured at a fundamental frequency, a network analyzer is used. Where measurement of amplitudes at different frequencies across an entire spectrum is desired, a spectrum analyzer is used. Other instruments that may be used include lock-in amplifiers, microwave transition analyzers measuring at one frequency and its harmonics, vector voltmeters and power meters with tunable filters.

FIG. 7 shows an image obtained of an edge of a pore on the surface using an STM employing the system of the invention of the parent application. Since the invention functions at the atomic or molecular level, it is possible to detect and measure surface species and other local phenomena.

The concept of this invention can be used not only for application to STM but also to other technologies including Coulomb blockade applications and electrochemical applications.

The invention of the parent application is particularly useful for detecting fast electrochemistry. This is useful for analyzing electrochemically generated species before they diffuse away from the electrode at which they are generated and/or undergo subsequent reaction. It is also possible to analyze chemical species where the electrochemical environment is rapidly changing, such as in electrochemical probing of living cells. Fast electrochemistry can also be used to determine reaction rates and mechanisms. By using a very high modulation frequency, it is possible to measure extremely small numbers of molecules at very small electrodes by being able to measure a signal from each molecule present repeatedly as a form of signal amplification.

FIG. 8 is a schematic view of an electrochemical cell and a circuit of a potential controlling and current measuring instrument for monitoring the cell in a conventional arrangement taken from "Ultramicroelectrodes: Cyclic Voltammetry Above One Million V $s^{-1}$," by Andrieux et al , *J. Electroanal. Chem.*, 248:447-450 (1988). As shown in FIG. 8, electrochemical cell 100 is monitored by circuit 102 having counter electrode C, reference electrode R, and working electrode W. The scheme in FIG. 8 can be readily modified so that a concept of the invention may be applied thereto. In reference to FIGS. 1 and 8, the working electrode W is connected to analyzers 30 in the same way as counter electrode 28 of FIG. 1. The output of oscillator 21 is applied to counter electrode C and reference electrode is connected to analyzers 30. Then the above-described operation for the STM may be adapted for measuring the fast electrochemistry of cell 100.

By using a very small working electrode, the capacitance of the bilayer (the molecules aligned at the electrode surface) is reduced, thereby reducing the associated RC time constant of the electrochemical cell 100 in order to increase the speed of the measurement. In reference to FIG. 8, a high frequency AC signal with or without a DC bias is applied to the counter electrode and the frequency spectrum at the current at the working electrode is sensed. The frequency spectrum obtained from such measurements will reflect the current/voltage curves, since the current/voltage characteristics of the electrochemical cell are highly non-linear. Working at high frequency will outrun certain processes such as diffusion of electrochemically generated species away from the electrode. The DC bias can also be set to a feature of interest in the current/voltage characteristic of the electrochemical cell. Then by varying the modulation frequency, the rate of the electrochemical process can be monitored. As described in more detail below in reference to FIG. 14 of this application, in addition to an AC signal source, a source for applying a DC bias voltage and current is also included so that the AC signal from the oscillator 21 is superposed onto such DC signal before the summed time varying signal is applied to the cell 100.

FIG. 9 is a schematic view of a Coulomb blockade device 200 sandwiched between two conductive layers 204, 206 connected respectively to electrodes 208, 210. Again the dotted line box in FIG. 1 is replaced by the Coulomb blockade device 200 of FIG. 9 so that the general scheme of FIG. 1 may be used for monitoring the Coulomb blockade device 200. More specifically, electrode 208 may be connected to the network analyzers 30 through conductor 40 and electrode 210 may be connected to oscillator 21 through conductor 24. The scheme of FIG. 1 can then be used for measuring thresholds and charge dissipation rates in a manner similar to that described above for the STM. The thresholds are measured by varying the amplitude of the applied AC signal. When the amplitude is increased and a threshold is reached, only the peak of the sine wave will be at sufficient amplitude to transfer a second, third . . . electron across the insulating barrier 202. Thus, there will be a signal that is a fairly sharp feature in time. Short time features such as these correspond to high frequencies. An increase in the higher harmonics as this threshold is surpassed is expected. As the amplitude is further increased, the time period over which the sine wave amplitude is over the threshold is increased. This gives a more slowly varying signal, so that the amplitude of the higher harmonics decreases relative to the lower harmonics. If the amplitude of the current or voltage across the electrodes 208, 210 are monitored at frequencies within a spectrum, the spectra obtained may be transformed using Fourier transform to obtain the threshold. Alternatively, if simply an indication of the threshold is needed, the sudden change in current or voltage across the electrodes 208, 210 will be adequate.

To measure the charge dissipation rates across device 200, after the thresholds are known, the modulation frequency is varied with the amplitude held constant. If charge escapes during a period, then the threshold (which is due to repulsion from the previous tunneled charge) disappears as does the corresponding non-linearity. The higher harmonics would then decrease as the signature that the dissipation is taking place on the time scale of the modulation. Again, by comparing the amplitudes of the high harmonics to those of the low harmonics of the driving frequency, such dissipation can be detected. This is the case also when a sample or an electrochemical cell is measured using a STM. By applying a summed signal having both AC and DC components in the manner described below in reference to FIG. 14, it is possible to maintain a DC bias at a certain level that would match or approach the threshold concerned while varying the modulation frequency or amplitude.

Since different molecules or particles will exhibit different spectra, it is possible to record the atomic or molecular spectra of a known substance to be a signature for comparison with atomic or molecular spectra of an unknown substance detected using the scheme above. The comparison will yield useful information on the composition of the unknown substance.

Most of the above description is taken from the parent application. Further aspects of this invention will be explained below in reference to FIGS. 10-12. As described above, for a given substance in the sample, an optimum value may be obtained for the frequency of the signal applied by oscillator 21, such as one which maximizes the signal detected as illustrated in FIG. 6. Such optimum frequency is a characteristic of the substance. Generally speaking, two different substances will have two different optimum frequencies neither of which is an integral multiple of the other; in other words, the optimum frequency of each of the two substances is not a harmonic of the optimum frequency of the other substance.

In reference to FIG. 1, when sample 26 includes two different substances, two different optimal frequencies will be discovered using the apparatus of FIG. 1 as the fundamental frequency of the signal applied by oscillator 21 is swept. In such circumstances, one would have to choose one of the two optimal frequencies to maximize the signal recorded since oscillator 21 can only be tuned to one of the two optimal frequencies. Therefore, to obtain maximum recorded signals for the two substances, one would normally have to first tune oscillator 21 to one optimal frequency during a first run for measuring a first substance, and tune the oscillator to a second optimal frequency to measure a second substance during a subsequent second run. If the two substances are present simultaneously only for a short time period, measuring the two substances sequentially as described may not be feasible. It is therefore desirable to provide a system whereby two or more substances may be detected simultaneously and at optimal frequencies.

Where two different substances close together are measured over a spectrum as the input frequency is swept, the above described scheme may need to be modified. Instead of finding a single optimal frequency for both substances, to differentiate between the responses of the two substances, one would attempt to find a first optimal frequency where the response of a first substance is measurably higher than that of a second substance, and a second optimal frequency where the response of the second substance is measurably higher than that of the first substance. This may be possible even though at many other frequencies other than the first and second frequencies, the responses of the two substances are nearly the same. In such event, it would be useful to identify each of the substances by more than one frequency as its characteristic frequencies. Therefore, to obtain optimized results, one would supply to the ACSTM an input signal having components at each of the optimal frequencies.

FIG. 10 is a schematic view of a high frequency STM for imaging substances using a network or spectrum analyzer and multiple oscillators to illustrate the invention of this application. For convenience and description, identical components are labeled by the same numerals in all the figures of this application. The scheme 300 in FIG. 10 differs from that of FIG. 1 in that n microwave sweep oscillators 21(1), 21(2), . . . , 21(n) are used to supply signals of multiple frequencies instead of only one oscillator 21 supplying signals of a single frequency input. The output of oscillator 21(1) is applied to a combiner 302(1) where the output is split into two paths: one path towards combiner 302(2) and the other to the external reference port of the network/spectrum analyzer 30. Combiner 302(2) combines the outputs of oscillators 21(1), 21(2) and sends the combined signal to combiner 302(3) (not shown) which combines such combined signal with the output of oscillator 21(3) (not shown) and so on until combiner 302(n) combines the output of oscillator 21(n) with the outputs of the remaining (n−1) oscillators, and sends the combined signal from the n oscillators along line 24 to the STM probe 22. The combined signal from line 24 is applied to tip 22a and a current or voltage between electrodes 22, 28 is monitored by analyzer 30 or analyzer 306 in a manner described above. Instead of applying the signal to the probe 22, it is possible to apply it instead to the counter electrode and thus to the sample; the response of the sample is then detected using the probe. As described below in reference to FIG. 14, a DC voltage or current source may be used in addition to supply a DC bias voltage and current upon which the AC combined signal from the outputs of the oscillators are superposed and the combined or summed time varying signal including DC and AC components supplied to probe 22 or counter electrode through line 24. Such source has been omitted from FIG. 10 for simplicity, it being understood that such optional source is intended and is very useful for electrochemical and Coulomb blockade device applications as explained below. Alternatively, instead of using a number of oscillators and a DC source, it is also possible to use a source generating signal pulses or transients. In general, one can use a source that generates a DC signal, an AC signal, a signal pulse or a signal transient or a combination of two or more thereof; all such variations are within the scope of the invention.

A combiner that may be used is a combiner/splitter, although other devices that combine signals may be used as well and are within the scope of the invention. While the embodiments may be described in terms of combining signals and applying the combined signal to the ACSTM, it will be understood that mixers (not shown) may be used to mix the input signals instead and the mixed signal applied to the ACSTM and the invention as described herein will function in essentially the same way to provide all the advantages described herein. In such case, each of the combiners 302(1), 302(2), . . . , 302(n) would be replaced by a mixer instead.

If analyzer 30 is generating a feedback signal to controllers 34, then a separate spectrum analyzer 306 is needed to detect and record the detected signal spectrum while analyzer 30 is generating the feedback control signal. For this purpose, combiner or signal splitter 304 sends the current or voltage signal from the counter electrode 28 to analyzers 30 and 306.

Each of the frequencies of the outputs of the n oscillators can be chosen to isolate or to indicate particular features such as the use of spectral signatures or functional groups of molecules of interest. Each frequency or a combination of frequencies can be used to probe a particular chemical or physical aspect of the sample. In the context of this application, a combination of frequencies is defined as integral multiples (harmonics) of each of the frequencies, and/or sums or differences of such frequencies or multiples. Each of the frequencies from the oscillators and combinations thereof may be detected simultaneously using the spectrum/network analyzer 306. It is therefore possible to map the regions of surfaces containing particular chemical species or exhibiting particular phenomena (e.g., electrical charging).

Since the signal applied to probe 22 has a number of different input frequencies, the voltage or current signal detected from the counter electrode 28 and fed to analyzer 306 also has such frequencies and/or combinations thereof. One of these frequencies may be used for feedback purposes to control piezo controllers 34 and in order to control the height of probe 22 above counter 28. This may be accomplished by moving the probe tip or by moving the counter electrode and the sample. Thus, the detected signal from counter electrode 28 is split by combiner 104 into two paths, one to analyzer 30 and the other to spectrum analyzer 306 for spectroscopy. Analyzer 30 then uses one of the frequencies in the current or voltage from counter 28 to derive an error signal in a feedback path 110 to controllers 34 for controlling the height of probe 22 to reduce such error signal. For this purpose, the controllers 34 may control either the position of the probe tip 22a as shown in FIG. 10, or the position of the counter electrode 28 and the sample (not shown). It will be understood that manners of control other than those discussed above may also be used, such as a DC voltage from an optional DC source (not shown in FIG. 10). When an AC or DC feedback is employed to derive an error signal, such feedback action would tend to reduce the error signal so as to maintain a constant current flow between tip 22 and counter electrode 28. Alternatively, the feedback voltage may be turned to a very low value or not applied at all to controllers 34 in a "constant height mode."

The above-described scheme for the ACSTM may also be applied to scanning near-field optical microscope 200 as shown in FIG. 11. Scanning near-field scanning optical microscopes (SNOMs) are described in: (1) "Breaking the Diffraction Barrier: Optical Microscopy on a Nanometric Scale," by Betzig and Trautman, *Science,* Vol. 251, pp. 1468–1470, Mar. 22, 1991; and (2) "Near-Field Optics: Microscopy, Spectroscopy, and Surface Modification Beyond the Diffraction Limit," by Betzig and Trautman, *Science,* Vol. 257, pp. 189–195, Jul. 10, 1992.

FIG. 11 is a schematic view of a SNOM for imaging a sample to illustrate the invention. As shown in FIG. 11, the SNOM 400 operates in a manner similar to the ACSTM 300 of FIG. 10. As in conventional SNOMs described by Betzig and Trautman, the SNOM probe 402 has a tip 402a close to the sample 404. The light from tip 402a is modulated by the sample, and the modulated light signal is detected by a spectrometer 410. When the spectrometer is in its solid line position, the spectrometer detects the light that is transmitted by sample 404. Alternatively, the spectrometer may be in its dotted line position labeled as 410'; in this position, the spectrometer would detect the light that is scattered or reflected by the sample along dotted line arrows 412.

As in the embodiment of the ACSTM of FIG. 10, the SNOM 402 of system 400 is supplied with light of multiple frequencies by n lasers or other light sources 420(1), 420(2), ..., 420(n), where the light output of these n sources is combined by (n−1) combiners 422, before the combined light signal is applied to probe 402. As in the case of the ACSTM, the outputs of the n sources may also be mixed and the mixed signal applied instead; such configurations are within the scope of the invention. The position of SNOM tip 402a or of sample 404 may be controlled by piezo controllers 34 through a conventional control scheme (not shown) in SNOM. System 400 enables multiple species and different chemical or physical aspects of substances to be detected simultaneously, as in the case of the ACSTM of FIG. 10. As in ACSTM, the substances generally have different characteristic optical frequencies at which the detected signal amplitude is optimized. By supplying an input optical signal with multiple frequencies, it is possible to detect and record multiple substances simultaneously. Therefore, the spectrometer is used to measure the input signal as modulated by the substances at the different input frequencies. While only the use of optical frequencies are described in the SNOM, it will be understood that electromagnetic signals at other than optical wavelengths may be used in essentially the same scheme as in SNOM; all such variations are within the scope of the invention.

By combining or mixing electrical signals of different frequencies, the embodiment of FIG. 10 enables sums and differences or other combinations of the n frequencies to be generated and applied to the sample 26. This is advantageous for a number of reasons as described below.

The signal output resulting from combining two sine wave signals of different frequencies is illustrated in FIG. 12. As shown in FIG. 12, by combining two signals of different amplitudes, one would obtain sharp spikes 350 of amplitudes greater than the amplitudes of the two sine wave signals from the oscillators, the sine wave signals being combined to obtain the wave form of FIG. 12. The sharp spikes 350 are of a shape determined by the sum of the frequencies of the two input sine waves, where the sharp spikes 350 would occur at a frequency equal to the difference between the two input sine wave forms. In FIG. 12, the period of such spikes 350 is t, which is greater than the periods of either one of the two input sine wave forms. The duty cycle of the spikes is 1/t.

Where FIG. 12 is a graphical illustration of a voltage wave form of the signal resulting from combining input voltage signals of two different frequencies, the wave form obtained has a higher amplitude than the two input voltage signals. It is evident that spikes 350 exceed the threshold 352 only for short periods of time at a duty cycle 1/t. If the voltage wave form of FIG. 12 is generated by combining two voltage wave forms having frequencies $f1$, $f2$, then the duty cycle 1/t is given by the difference frequency $f1-f2$ of the two input frequencies. The shape of the spikes 350 is determined by the sum $f1+f2$ of the two input frequencies. Therefore, by choosing the proper input frequencies $f1$, $f2$, it is possible to control the shape of the spikes 350 as well as the duty cycle of the spikes. Instead of combining the input signals as illustrated in FIG. 12, it is also possible to mix the input signals and apply the mixed signal instead to form wave forms of the desired shape and duty cycle. Where the voltage wave form of the signal applied to the probe tip 22a of the ACSTM or sample 26 results from combining or mixing more than two signals of different frequencies, it is possible to further fine tune the shape and duty cycle of the spikes. By combining or mixing input signals of two frequencies and applying the combined or mixed signal to the ACSTM, the response of the substance(s) may be measured at the difference frequency instead of at higher frequencies. This may be advantageous if measurement at such low frequency has a better signal to noise ratio than at certain higher frequencies.

The scheme of FIG. 10 may be advantageous for applications in electrochemistry, such as when applied to the electrochemical cell of FIG. 8, or simply where sample 26 in FIG. 10 is undergoing electrochemical changes, such as in a living cell. By using multiple source and detection frequencies, it is possible to analyze and to separate the effects of more than one electrochemically generated species prior to diffusion away from the electrode at which they are generated and/or subsequent reaction. It is also possible to analyze simultaneously multiple chemical species where the electrochemical environment is rapidly changing, such as in electrochemical probing of living cells. It is also possible to determine "fast" reaction rate and mechanisms. The separation/speciation of the multiple components in each case could be done on the basis of: (1) the diffusion rate to and from the electrode, (2) the generation or reaction rate adds on near the electrode, and (3) the generation or reaction potential. This is explained in more detail below.

As discussed above in reference to FIG. 12, by combining two sine wave signals of different frequencies and amplitudes, one would obtain sharp spikes 350 of amplitudes greater than the amplitudes of the two sine wave signals from the oscillators, where the sharp spikes 350 are of a shape determined by the sum of the frequencies of the two input sine waves, where the sharp spikes 350 would occur at a frequency equal to the difference between the two input sine wave forms. Such multiple frequency wave form as shown in FIG. 12 will be useful in electrochemistry. Thus, if sharp spikes 350 obtained from combining two frequencies from two oscillators from 21(1)–21(n) are at an amplitude which exceeds certain generation or reaction potentials, certain species A would cause to be generated at the electrodes by such voltage spikes. Such species A then reacts with another species B to give rise to another species C. If all of the species B near the electrodes have been consumed by the reaction, such reaction cannot continue until species B has time to diffuse to the vicinity of the electrodes again. In such event, the input frequencies of the two oscillators from 21(1)–21(n) may be controlled so as to give rise to a long enough period t (relaxation time), to allow adequate time for a species B to diffuse to the vicinity of the electrodes. Then another sharp spike 350 would occur, causing the species A generated to again react with species B to generate species C. In order to provide a detectable signal, the different species must be detected repeatedly at the difference frequency between the two input sine wave frequencies to yield a detectable signal at the analyzer 306. In other words, an electrochemical signal due to this event would appear at the difference frequency, such as f1−f2 or its harmonics, where f1, f2 are input frequencies at two of the oscillators 21(1)—21(n).

FIGS. 13A, 13B are schematic views of a one-dimensional array and a two-dimensional array respectively of Coulomb blockade devices that are currently used. FIGS. 13A, 13B are taken from "Single Charge Tunneling Coulomb Blockade Phenomena in Nanostructures," edited by Hermann Grabert and Michel H. Devoret, NATO ASI Series, Series B: Physics, Vol. 294, Chap. 1, page 17, FIG. 9. As described in the above-referenced book edited by Grabert and Devoret, when the appropriate AC voltages with frequency f are applied to the gates (i.e., to the nodes 504(1), 504(2), . . . , 504(m−1)) in FIG. 13A, between adjacent blockade devices 502(1), 502(2), . . . , 502(m), the current flowing between input 506 and output 508 is proportional to the frequency f. Therefore, by controlling the frequency applied, it is possible to generate precise currents. This is the basis of high precision single charged tunneling current sources. See Devoret and Grabert, page 16, lines 1–7.

For the array 500 to act as an effective current standard, it is desirable for the devices 502(1)–502(m), collectively referred to as devices 502, to have the same resonance frequency. If the devices 502 have somewhat different resonance frequencies, this will cause array 500 used as a current standard to be inaccurate. To detect whether the Coulomb blockade devices have the same resonance frequencies, an input signal including components at two frequencies which are different by a small offset may be applied to the input 506 and the current or voltage at 508 is measured at said at least two frequencies or their harmonics, or various combinations thereof to indicate the accuracy of the standard. In other words, if current standard 500 responds to such input signal by causing a current or voltage at output 508 to include both frequencies or their harmonics, or various confirmations thereof, it tends to indicate that the devices have different resonance frequencies. The apparatus of FIG. 10 may be applied to the current standard 500 by replacing the dotted line box in FIG. 10 by the array 500 so that line 24 is connected to the input 506 and the output 508 of the apparatus 500 is connected to splitter 304.

The above-described adaptation of FIG. 10 connected to array 500 may also be used to detect thresholds of the devices 502 and their charge dissipation characteristics. This can be performed by applying a voltage input signal having the wave form shown in FIG. 12 to the input 506 of the array 500. The voltage wave form of FIG. 12 is obtained again by combining two input voltage wave forms, with frequencies f1, f2 respectively. The respective amplitudes of the two input voltages are varied so that the amplitude of spikes 350 is increased to exceed a predicted threshold 352 of one of the Coulomb blockade devices in the array 500. As discussed above, threshold 352 is indicated by the detection of an increase of higher harmonics and their combinations in the spectra. Thus, threshold 352 of the device would be predicted or indicated by presence of large amplitudes of the higher harmonics of the difference frequency f1−f2 or their combinations in the current or voltage detected by the ACSTM.

The charge dissipation characteristics of the Coulomb blockade devices in the array may be detected as follows. If the frequency f1 is higher than the frequency f2, then the oscillator that generates the voltage signal at frequency f1 is tuned to reduce the frequency f1, while maintaining the same amplitude. If spikes 350 are indeed just above threshold 352, and if the time period during which the spikes exceed threshold 352 becomes comparable to the time scale of dissipation of the devices, this tuning has the effect of broadening the spikes 350 (by reducing f1+f2), thereby increasing their widths, and reducing the difference frequency f1−f2. This prolongs the time during which the total input voltage wave form shown in FIG. 12 exceeds the threshold 352 of the particular Coulomb blockade device, and causes the amplitudes of the higher harmonics of the difference frequency f1−f2 and their combinations to decrease relative to the amplitudes of the lower harmonics of the difference frequency and their combinations. Comparison of the amplitudes of the higher and lower harmonics of the difference frequency as the higher frequency of the frequencies of the two sine waves combined is reduced would indicate the time scale of charge dissipation of the Coulomb blockade devices. While the invention as applied to array 500 is illustrated above by example to an array 500 where the blockade devices are arranged in series, it will be understood that the invention is similarly applicable where the devices are arranged in parallel instead or an array with a combination of series and parallel connected devices.

The above described schemes for detecting inaccuracies in array 500 used as a current standard or threshold detection in array 500 may also be applied to the two-dimensional array 600 with input 606 and output 608 in the manner similar to that described above for array 500, where line 24 of FIG. 10 is connected to input 606 and output 608 of array 600 connected to splitter 304 in FIG. 10, replacing the dotted line box in FIG. 10.

FIG. 14 is a schematic diagram of a high frequency STM for imaging insulator or conductive surfaces using throughput attenuation with a network analyzer, or using non-linear harmonic recording with a spectrum analyzer, and a DC source and a DC detector. From a comparison of FIGS. 1 and 14, it will be evident that, in addition to the components present in FIG. 1, device 700 also includes a DC source 702. The DC voltage from source 702 is coupled together with the AC signal from the sweep oscillator 21 through a bias network 704 to line 24 connected to the tip 22a of the STM. Bias network 704 includes an inductor 706 for coupling a DC voltage or low frequency signal to line 24. The high frequency signal from oscillator 21 is coupled to line 24 through a capacitor 708 in the bias network. In this manner, bias network 704 adds the DC bias voltage or a low frequency signal from source 702 to the high frequency signal from the sweep oscillator 21 and supply the summed signal having both DC and AC components to line 24.

To detect the current that passes between tip 22a of the STM and counter electrode 28 through the sample (not shown), the signal from counter electrode 28 is fed through another bias network 704 which separates the DC or low frequency components from the high frequency components which are supplied through capacitor 708 to line 40 which is connected to a spectrum or analyzer 30. The DC or low frequency components of the current from counter electrode 28 are coupled through an inductor 706 to a current amplifier 710 to detect the DC or low frequency current. The current detected by amplifier 710 may be fed back to piezo controllers 34 in the constant current mode in lieu of or in addition to the AC signal detected as described above. Instead of using oscillators and a DC source as described above in reference to FIG. 14, it is also possible to employ a source generating a signal pulse or a signal transient. In general, one can use a source that generates a DC signal, an AC signal, a signal pulse or a signal transient or a combination of two or more thereof; all such variations are within the scope of the invention.

If instead of using a voltage source 702 to supply a DC voltage and current, a DC or low frequency current source is used instead, device 700 is modified simply by replacing the voltage source 702 by a low frequency or DC current source and the current amplifier 710 is replaced by a voltmeter for detecting the DC or low frequency voltage across the sample. Aside from such change, device 700 will function in essentially the same manner as that described above. Instead of applying the summed signal having both AC and DC components to tip 22a of the STM as described above, such signal may instead be applied to the sample through counter electrode 28; in such event, the current through a sample is then detected at tip 22a of the STM so that the tip is then connected to analyzer 30 and detector 710 through the bias network 704 instead. Such and other possible variations are all within the scope of the invention.

While the invention is described above in reference to various embodiments, it will be understood that various changes and modifications may be made without departing from the scope of the invention which is to be limited only by the appended claims. For example, while the embodiments are illustrated showing a gap between the tip of the STM and the sample, this is not required and the invention may function essentially as described even though the tip contacts the sample.

What is claimed is:

1. An apparatus for detecting threshold phenomena associated with and/or atomic or molecular spectra of at least two substances in the vicinity of each other, comprising:
   a source providing a time varying electrical signal, said signal including components of at least two different frequencies, wherein said at least two frequencies individually or in combination are characteristic of said at least two substances;
   electrodes for coupling the signal to said at least two substances; and
   a circuit substantially simultaneously measuring the amplitudes of the current or voltage across the substances at said at least two frequencies or their harmonics, or their sums and differences or combinations thereof to detect threshold phenomena associated with and/or atomic or molecular spectra of the at least two substances.

2. The apparatus of claim 1, said source including a plurality of signal generators that each provides an electrical signal with frequencies in a band frequency band.

3. The apparatus of claim 2, said generators each comprising an oscillator, wherein said source further comprises a combiner connecting the oscillators.

4. The apparatus of claim 1, wherein neither of said at least two frequencies is an integral multiple of the other.

5. The apparatus of claim 1, wherein the components of at least two different frequencies cause a pulse of amplitude higher than the amplitudes of the components to occur at a frequency lower than the at least two different frequencies.

6. The apparatus of claim 5, wherein said substances are undergoing electrochemical changes, and wherein said source is such that said pulse alters the electrochemical changes, or is characteristic of substances at the electrodes or rates of the electrochemical changes.

7. The apparatus of claim 5, wherein the components combine or mix to form a signal with spikes of a shape determined by the sum of the at least two frequencies, said spikes occurring at a frequency substantially equal to the difference between the at least two frequencies.

8. The apparatus of claim 7, said circuit measuring at the difference frequency of the at least two frequencies to increase signal/noise ratio.

9. The apparatus of claim 1, one of said electrodes having a tip spaced apart by vacuum, a gas or fluid from the substance.

10. The apparatus of claim 9, further comprising:
    a feedback circuit for deriving an error signal; and
    a controller moving the tip or the substances to change the distance between the tip and the substances in response to the error signal in order to reduce the error signal.

11. The apparatus of claim 1, wherein said source provides an AC electrical signal, a DC voltage or current, an AC electrical signal superposed upon a DC voltage or a signal pulse or transient.

12. The apparatus of claim 1, wherein said source provides a signal that is a DC signal, an AC signal, a signal pulse or signal transient or a combination of two or more thereof.

13. The apparatus of claim 1, said source providing a signal including components at frequencies in a range from 1.5 to 22 Ghz.

14. The apparatus of claim 1, said apparatus being a part of a scanning tunneling microscope having a probe, wherein one of the electrodes is the probe of the microscope.

15. A method for detecting threshold phenomena associated with and/or atomic or molecular spectra of at least two substances in the vicinity of each other, comprising:
    providing a time varying electrical signal, said signal including components of at least two different frequencies, wherein said at least two frequencies individually or in combination are characteristic of said at least two substances;
    coupling the signal to said at least two substances; and
    substantially simultaneously measuring the amplitudes of the current or voltage across the substances at said at least two frequencies or their harmonics, or their sums and differences or combinations thereof to detect threshold phenomena associated with and/or atomic or molecular spectra of the at least two substances.

16. The method of claim 15, wherein neither of said at least two frequencies provided by the providing step is an integral multiple of the other.

17. The method of claim 15, wherein the components at at least two different frequencies provided by the providing step cause a pulse of amplitude higher than the amplitudes of the components to occur at a frequency lower than the at least two different frequencies.

18. The method of claim 17, wherein said substances are undergoing electrochemical changes, and wherein the providing step is such that said pulse alters the electrochemical changes, or is characteristic of substances at the electrodes or rates of the electrochemical changes.

19. The method of claim 15, wherein the providing step combines or mixes the components to form a signal with spikes of a shape determined by the sum of the at least two frequencies, said spikes occurring at a frequency substantially equal to the difference between the at least two frequencies.

20. The method of claim 19, said measuring step measuring at the difference between the at least two frequencies to increase signal/noise ratio.

21. The method of claim 15, said method employing an electrode having a tip, said providing step including supplying said time varying signal to said electrode and moving the tip of the electrode to a location in contact with or close to the substances.

22. The method of claim 21, said method further comprising:
feeding back an error signal; and
moving the tip or the substances to change the distance between the tip and the substances in response to the error signal in order to reduce the error signal.

23. The method of claim 15, wherein said providing step provides a signal that is a DC signal, an AC signal, a signal pulse or signal transient or a combination of two or more thereof.

24. The method of claim 15, wherein said providing provides a signal including components at frequencies in a range from 1.5 to 22 Ghz.

25. The method of claim 15, said at least two substances located on a surface, further comprising scanning said surface during the providing, coupling and measuring steps so as to map the surface.

26. An apparatus for detecting threshold phenomena associated with and/or atomic or molecular spectra of at least one substance, comprising:
a source providing a time varying electrical signal, said signal including components of at least two different frequencies, said source including at least two signal generators each providing an electrical signal with frequencies in a frequency band including one of the at least two frequencies, and a combiner or mixer connecting the generators;
electrodes for coupling the signal to said at least one substance; and
a device substantially simultaneously measuring the amplitudes of the current or voltage across the substance at frequencies including said at least two frequencies or combinations thereof.

27. The apparatus of claim 26 said source providing a signal including components at frequencies in a range from 1.5 to 22 Ghz.

28. The apparatus of claim 26, said apparatus being a part of a scanning tunneling microscope having a probe, wherein one of the electrodes is the probe of the microscope.

29. A method for detecting threshold phenomena associated with and/or atomic or molecular spectra of at least one substance, comprising:
providing time varying electrical signals of at least two different frequencies;
combining or mixing said signals;
coupling the combined or mixed signals to said at least one substance; and
substantially simultaneously measuring the amplitudes of the current or voltage across the substances at frequencies including said at least two frequencies or combinations thereof.

30. The method of claim 29, wherein said providing provides signals at frequencies in a range from 1.5 to 22 Ghz.

31. The method of claim 29, said at least one substance located on a surface, further comprising scanning said surface during the providing, coupling and measuring steps so as to map the surface.

* * * * *

UNITED STATES PATENT AND TRADEMARK OFFICE
CERTIFICATE OF CORRECTION

PATENT NO. : 5,397,896
DATED : March 14, 1995
INVENTOR(S) : Weiss et al.

It is certified that error appears in the above-indentified patent and that said Letters Patent is hereby corrected as shown below:

On the Title Page [75] replace:
   "Inventors:   Paul Weiss; Stephen J. Stranick, both of, State College, Pa."

with
  --Inventors:   Paul Weiss; Stephan J. Stranick, both of State College, Pa.--

Signed and Sealed this

Ninth Day of January, 1996

Attest:

BRUCE LEHMAN

*Attesting Officer*      *Commissioner of Patents and Trademarks*